(12) United States Patent  (10) Patent No.: US 7,126,404 B1
Rosen  (45) Date of Patent: Oct. 24, 2006

(54) HIGH RESOLUTION DIGITAL DELAY CIRCUIT FOR PLL AND DLL

(75) Inventor: Eitan Rosen, Abirim (IL)

(73) Assignee: Marvell Semiconductor Israel Ltd., Yokneam (IL)

( * ) Notice: Subject to any disclaimer, the term of this patent is extended or adjusted under 35 U.S.C. 154(b) by 0 days.

(21) Appl. No.: 10/973,963

(22) Filed: Oct. 25, 2004

Related U.S. Application Data

(60) Provisional application No. 60/537,598, filed on Jan. 20, 2004.

(51) Int. Cl.
   *H03K 3/00*  (2006.01)

(52) U.S. Cl. .................. 327/292; 327/272; 327/273

(58) Field of Classification Search ............... None
   See application file for complete search history.

(56) References Cited

U.S. PATENT DOCUMENTS

| | | | | |
|---|---|---|---|---|
| 4,975,930 A |    | 12/1990 | Shaw ........................... | 375/120 |
| 5,218,314 A |    | 6/1993  | Efendovich et al. ......... | 328/155 |
| 5,544,203 A |    | 8/1996  | Casasanta et al. ........... | 375/376 |
| 5,719,515 A | *  | 2/1998  | Danger ......................... | 327/270 |
| 5,832,048 A |    | 11/1998 | Woodman, Jr. ............... | 375/376 |
| 5,900,762 A | *  | 5/1999  | Ramakrishnan ............. | 327/277 |
| 6,034,558 A | *  | 3/2000  | Vanderschoot et al. ...... | 327/277 |
| 6,046,620 A | *  | 4/2000  | Relph ........................... | 327/277 |
| 6,449,327 B1|    | 9/2002  | Rosen ........................... | 377/33  |
| 6,473,478 B1|    | 10/2002 | Wallberg et al. ............. | 375/376 |
| 6,542,040 B1|    | 4/2003  | Lesea ........................... | 331/11  |

OTHER PUBLICATIONS

Sheng Ye et al. "Techniques for Phase Noise Suppression in Recirculating DLLs", IEEE Journal of Solid State Circuits, vol. 39, No. 8, Aug. 2004, pp. 1222-1230.

* cited by examiner

*Primary Examiner*—Timothy P. Callahan
*Assistant Examiner*—An T. Luu

(57) ABSTRACT

High resolution digital delay circuits and methods are provided. A multiplexer receives the outputs of first and second delay elements. At least the second delay element is adjustable using a digital control signal. The multiplexer and the first delay element form a first delay loop. The multiplexer, the first delay element and the second delay element form a second delay loop. A logic circuit monitors the number of times (M) that a signal cycles through the first loop. After M reaches a predetermined value (i.e., when the signal is delayed by a predetermined delay), the multiplexer receives a control signal that causes the second loop to close. A signal cycles through the second loop, which provides additional delay. Preferably, the signal cycles through the second loop only once. Generally, this causes the resolution of the delay circuit to be proportional to the minimum delay adjustment of the second delay element.

42 Claims, 4 Drawing Sheets even when the signal has been delayed by a predetermined amount of delay), the multiplexer receives a control signal that causes the second loop to close. The predetermined number may be adjustable. A signal cycles through the second loop, which provides additional delay. Preferably, the signal cycles through the second loop only once before the multiplexer control signal causes the first circuit loop to close. Generally, this causes the resolution of the delay circuit to be proportional to the minimum delay adjustment of the second delay element.

The invention also provides methods for providing high resolution digital delay.

Further features of the invention, its nature and various advantages, will be more apparent from the accompanying drawings and the following detailed description of the preferred embodiments.

HIGH RESOLUTION DIGITAL DELAY CIRCUIT FOR PLL AND DLL

This claims the benefit of U.S. Provisional Application No. 60/537,598, filed Jan. 20, 2004, which is hereby incorporated by reference herein in its entirety.

BACKGROUND OF THE INVENTION

This invention relates to digital delay circuits. More particularly, this invention relates to high resolution digital delay circuits for phase-locked loops (PLLs) and delay-locked loops (DLLs).

PLLs and DLLs are widely used in many applications. Typically, PLLs and DLLs output one or more clock signals locked to both the phase and frequency of a reference clock. PLLs and DLLs lock the output clock to the reference clock by adjusting the time delay of an associated delay circuit. PLLs and DLLs may be used in dynamic random access memory (DRAM) applications to, for example, synchronize DRAM reads, writes and refreshes to a reference clock.

Conventional analog PLLs and DLLs use a plurality of analog voltage-controlled delay elements (VCDs) to lock the output clock to the reference clock. The time delays generated by the VCDs are adjustable and can be controlled by adjusting a control voltage. It is well known that analog designs are more difficult to mass produce reliably with stated specifications and are less portable to various process technologies than digital designs.

Conventional digital PLLs and DLLs use a plurality of serially-connected digital delay elements to lock the output clock to the reference clock. While the time delays of the digital delay elements are adjustable, in present art all of the delay elements are controlled simultaneously by the same digital control signal. In other words, the time delay of one delay element in the serially-connected chain cannot be adjusted without simultaneously adjusting the time delays of all other delay elements in the chain. This causes conventional digital delay circuits to have low resolution.

In general, higher resolution delay circuits (i.e., delay circuits that provide smaller minimum delay adjustments) allow associated PLLs and DLLs to more accurately lock the output clock to the reference clock. Higher resolution delay circuits also allow the associated PLLs and DLLs to more accurately maintain the locked condition in response to process, voltage and temperature (PVT) variations.

In view of the foregoing, it would be desirable to provide high resolution digital delay circuits.

SUMMARY OF THE INVENTION

It is an object of this invention to provide high resolution digital delay circuits.

In accordance with this invention, a digital delay circuit that includes a multiplexer, a first delay element and a second delay element is provided. At least the delay of the second delay element is adjustable using a digital control signal. The delay of the first delay element may also be adjustable. The multiplexer receives the outputs of the first and second delay elements. The multiplexer and the first delay element form a first circuit loop that provides a first delay ($d_{loop1}$). The multiplexer, the first delay element and the second delay element form a second circuit loop that provides a second delay ($d_{loop2}$). A logic circuit monitors the number of times (M) that a signal cycles through the first circuit loop. Each cycle through the first loop provides a delay of $d_{loop1}$. After M reaches a predetermined value (i.e.,

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention relates to circuits and methods for providing high resolution digital delay.

Figure 1:
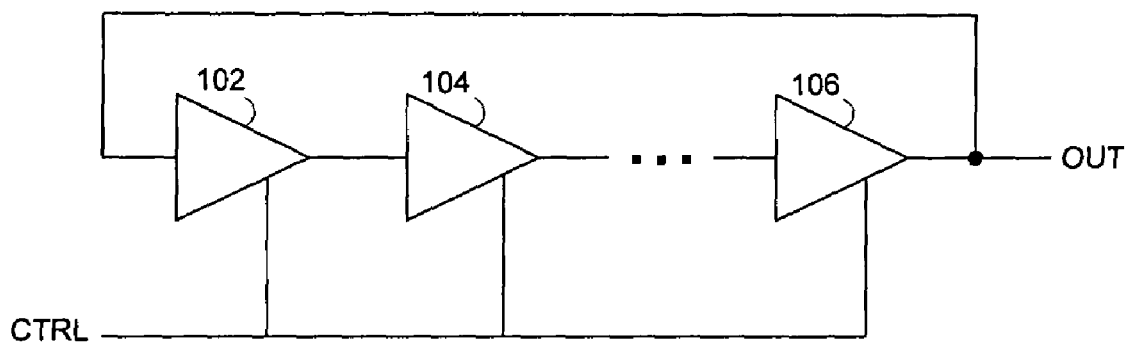
FIG. 1 is a block diagram of a conventional digital delay circuit.

FIG. 1 shows a conventional digital delay circuit 100. Delay circuit 100 includes N serially-connected digital delay elements 102, 104 and 106. N is generally an odd number such that delay circuit 100 forms an oscillator. While the time delays of digital delay elements 102–106 are adjustable, all of delay elements 102–106 are controlled simultaneously by the same digital control signal (CTRL). In other words, the time delay of one of digital delay elements 102–106 cannot be adjusted without simultaneously adjusting the delays of all other delay elements 120–106. This causes digital delay circuit 100 to have low resolution. Particularly, the minimum total delay adjustment that digital delay circuit 100 can provide is proportional to N*d, where N is the number of digital delay elements in the serially-connected chain and d is the minimum delay adjustment per delay element.

Delay circuit 100 is typically fabricated for use over a predetermined range of delay. Particularly, during fabrication of circuit 100, a fixed number (N) of delay elements 102–106 is connected in the serial chain of delay elements. As described above, this number (N) determines the resolution of circuit 100. This number (N) also determines the range of delay that circuit 100 can provide. For example, where each delay element is variable from 50 ps to 150 ps in increments of 5 ps, twelve delay elements connected in series (N=12) in circuit 100 provide a minimum delay of 600 ps (i.e., 12*50 ps=600 ps) and a maximum delay of 1800 ps (i.e., 12*150 ps=1800 ps). The resolution of such a delay circuit 100 is proportional to N*d=12*5 ps=60 ps. Other ranges of delay can be provided by including other numbers (N) of serially-connected delay elements in circuit 100. However, the resolution of circuit 100 decreases as N increases (i.e., as the range of delay that circuit 100 can provide increases). For example, when twenty-four serially-connected delay elements (N=24) are included in circuit 100, the resolution of circuit 100 is proportional to N*d=24*5 ps=120 ps.

Figure 2:
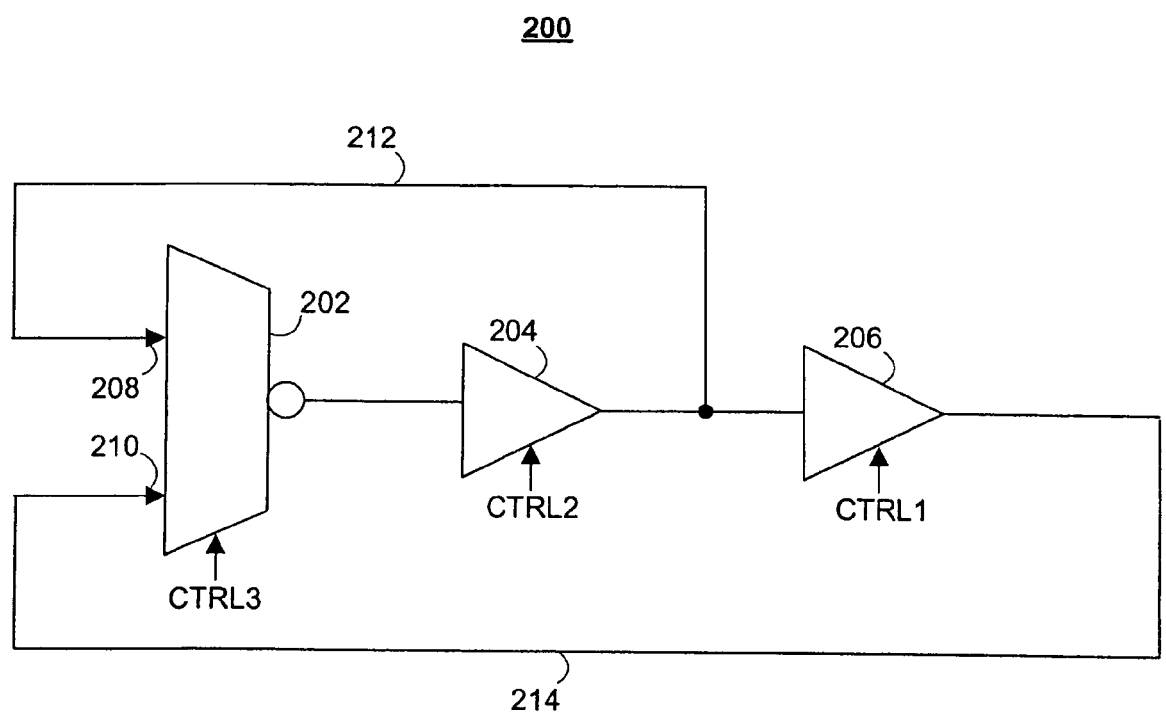
FIG. 2 is a block diagram of a digital delay circuit in accordance with the present invention.

FIG. 2 shows a digital delay circuit 200 in accordance with the present invention. Digital delay circuit 200 includes multiplexer 202 and delay elements 204 and 206. In one embodiment of the present invention, the time delay of delay element 206 is adjustable and is controlled by digital control signal (CTRL1). Delay element 204 has a fixed delay. In another embodiment of the present invention, the time delays of both of delay elements 204 and 206 are adjustable. Particularly, the time delay of delay element 106 is digitally controlled by a first digital control signal (CTRL1), and the time delay of delay element 104 is independently digitally controlled by a second control signal (CTRL2).

Multiplexer 202 receives the outputs of delay elements 204 and 206 at inputs 208 and 210, respectively. The output of delay element 204 is also coupled to the input of delay element 206. The output of multiplexer 202 is coupled to the input of delay element 204. Control signal (CTRL3) selects which of inputs 208 and 210 passes through multiplexer 202. When input 208 is selected, circuit loop 212 which includes multiplexer 202 and delay element 204 closes. The time delay associated with circuit loop 212 ($d_{loop212}$) is the sum of the time delays of multiplexer 202 ($d_{mux}$) and delay element 204 ($d_{204}$). When input 210 is selected by control signal (CTRL3), circuit loop 214 which includes multiplexer 202, delay element 204 and delay element 206 closes. Preferably, at most one of circuit loops 212 and 214 is closed at any given time. The time delay associated with circuit loop 214 ($d_{loop214}$) is the sum of the time delays of multiplexer 202 ($d_{mux}$), delay element 204 ($d_{204}$) and delay element 206 ($d_{206}$), or equivalently, the sum of the time delays of circuit loop 212 and delay element 206. The time delays associated with circuit loops 212 and 214 can be represented by the following equations:

$$d_{loop212} = d_{mux} + d_{204}$$

$$d_{loop214} = d_{loop212} + d_{206}$$

Both of circuit loops 212 and 214 are preferably configured such that loops 212 and 214 provide odd numbers of signal inversions. This causes circuit loops 212 and 214 to form ring oscillators. For example, for the case in which each of delay elements 202 and 204 provides two signal inversions (which causes each delay element to output a signal that is digitally in-phase with its respective input signal), multiplexer 202 may be an inverting multiplexer that provides one signal inversion. This causes circuit loop 212 to provide 3 signal inversions and causes circuit loop 214 to provide 5 signal inversions. Other ways of forming ring oscillators from circuit loops 212 and 214 are of course possible. As described below, forming ring oscillators from circuit loops 212 and 214 allows associated logic circuitry to monitor the progress of signals propagating along the loops.

Digital delay circuit 200 operates as follows: Control signal (CTRL3) selects input 208 of multiplexer 202, which causes circuit loop 212 to close. Circuit loop 214 is preferably open when circuit loop 212 is closed. Because loop 212 forms a ring oscillator, a signal begins to propagate along loop 212 when input 208 is selected. A logic circuit monitors the number of times (M) that the signal cycles through circuit loop 212. Each cycle through loop 212 delays the signal by $d_{loop212}$. When M reaches a predetermined value (i.e., when the signal has been delayed by a predetermined amount of delay), control signal (CTRL3) selects input 210 of multiplexer 202. This causes circuit loop 212 to open and causes circuit loop 214 to close. Logic circuitry suitable for generating control signal (CTRL3) and for monitoring signals propagating along circuit loops 212 and 214 is described below in connection with FIG. 3. Because loop 214 also forms a ring oscillator, the signal begins to propagate along circuit loop 214 when input 210 is selected. The signal cycles through loop 214, which causes the signal to be delayed by $d_{loop214}$. Preferably, the signal cycles through loop 214 only once before the logic circuitry reselects input 208 of multiplexer 202. This advantageously causes the resolution of circuit 200 to be proportional to the minimum delay adjustment of delay element 206. Other numbers of cycles through loop 214 may of course be provided. The total time delay of digital delay circuit 200 is the sum of the time delays caused by circuit loop 212 and circuit loop 214.

In accordance with the present invention, digital delay circuit 200 provides various levels of delay adjustment for adjusting the time delay of circuit 200. A first level of delay adjustment is provided by increasing or decreasing the number of times (M) that a signal passes through circuit loop 212. A second level of delay adjustment is provided by varying the time delay of delay element 204 using digital control signal (CTRL2). A third level of delay adjustment is provided by varying the time delay of delay element 206 using digital control signal (CTRL1). Typically, the third level of delay adjustment provides finer delay adjustments than the second level of delay adjustment, and the second level of delay adjustment provides finer delay adjustments than the first level of delay adjustment. In some embodiments of the present invention, less than all three levels of delay adjustment may be provided. For example, only the first and third levels of delay adjustment may be provided (e.g., when delay element 206 is a variable digital delay element and delay element 204 is a fixed delay element).

Figure 3:
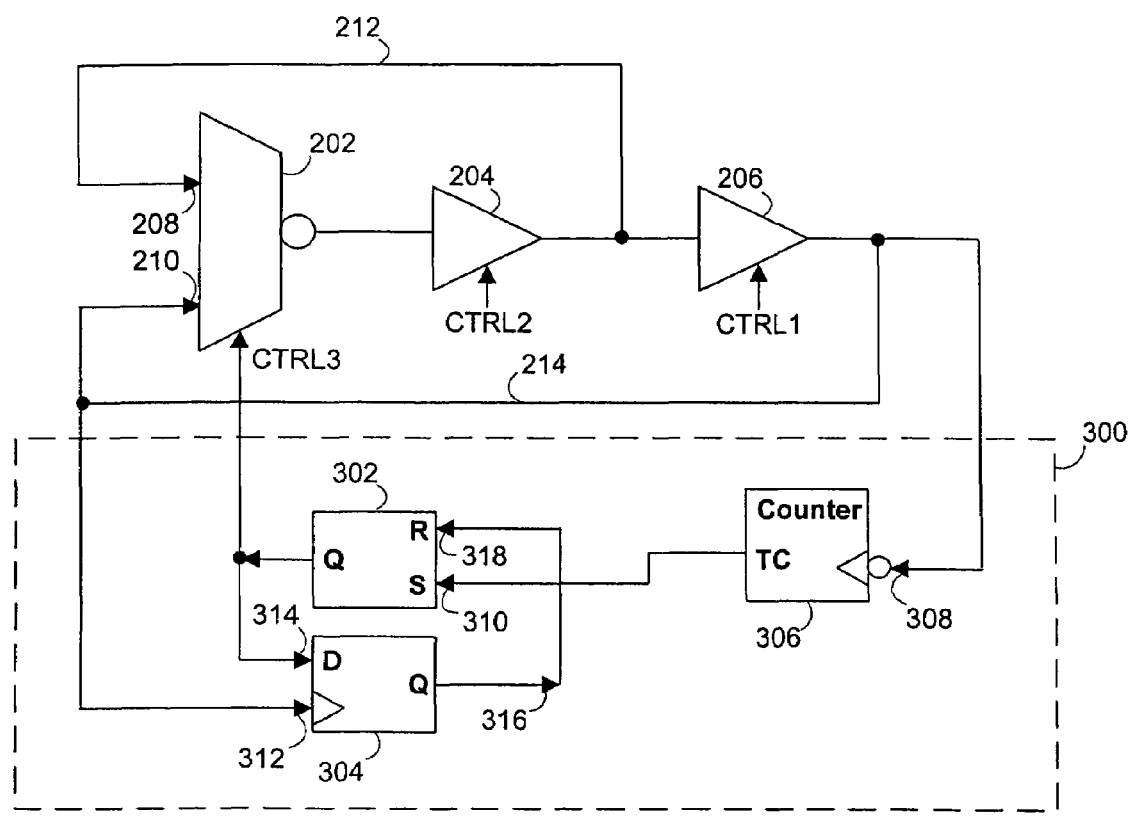
FIG. 3 is a block diagram of a logic circuit suitable for controlling the digital delay circuit of FIG. 2 in accordance with the present invention.

FIG. 3 shows a logic circuit 300 suitable for generating control signal (CTRL3) of multiplexer 202 and for monitoring signals along circuit loops 212 and 214 of digital delay circuit 200 (FIG. 2). Logic circuit 300 includes set/reset flip flop 302, D flip flop 304 and counter 306. For reasons described below, counter 306 is preferably a fast counter (e.g., a counter having a clock to output delay equal to about 2 inverter delays). An example of a fast counter is described in Rosen U.S. Pat. No. 6,449,327, which is hereby incorporated by reference herein in its entirety. Counter 306 receives the output of delay element 206 at input 308. In the embodiment of FIG. 3, input 308 is triggered by falling edges of an input signal (i.e., logic "1" to "0" signal transitions). In other embodiments of the present invention, input 308 of counter 306 may be triggered by rising edges of the input signal or by both rising and falling edges of the input signal. The output of counter 306 is coupled to set input (S) 310 of set/reset flip flop 302. D flip flop 304 receives the output of delay element 206 at clock input 312 and the output of set/reset flip flop 302 at data input 314. Output (Q) 316 of D flip flop 304 is coupled to reset (R) input 318 of set/reset flip flop 302. The output of set/reset flip flop 302 provides control signal (CTRL3) of multiplexer 202.

Set/reset flip flop 302 outputs a signal having a particular logic value (i.e., logic "1" or "0" when set input 310 is activated. This particular logic value depends on the chosen circuit implementation of flip flop 302. When reset input 318 is activated, set/reset flip flop 302 outputs a signal having the complement logic value. For example, when activating set input 310 causes set/reset flip flop 302 to output a logic "1", activating reset input 318 causes set/reset flip flop 302 to output a logic "0".

D flip-flop 304 transfers data from data input (D) 314 to output (Q) 316 in response to receiving a clock edge at clock input 312. The data transferred to output (Q) 316 is the value of the logic signal (i.e., logic "1" or "0") received at data input (D) 314 immediately prior to the clock edge. In the embodiment of FIG. 3, input 312 is triggered by rising edges of an input signal (i.e., logic "0" to "1" signal transitions). In other embodiments of the present invention, input 312 may be triggered by falling edges of the input signal or by both rising and falling edges of the input signal.

Operation of logic circuit 300 is further described in the following example in which digital delay circuit 200 (FIG. 2) is configured to provide a total delay of 1250 ps. Multiplexer 202 provides a fixed delay of, for example, 100 ps. Each of delay elements 204 and 206 provides a delay that can be varied from 50 ps to 150 ps in increments of 5 ps (i.e., 5 ps is the minimum delay adjustment of each of the delay elements). These delay ranges and resolutions for delay elements 204 and 206 are only illustrative. Any other suitable delay ranges and resolutions may be provided. Additionally, delay elements 204 and 206 need not have the same delay ranges and resolutions. Delay element 204 is tuned to 80 ps using digital control signal (CTRL2) and delay element 206 is tuned to 85 ps using digital control signal (CTRL1). This causes circuit loop 212 to have a delay of 180 ps (i.e., $d_{loop212}$=100+80=180 ps), and causes circuit loop 214 to have a delay of 265 ps ($d_{loop214}$=100+80+85=265 ps). Counter 306 is configured to count to a terminal count (TC) of 3. As described above, input 308 of counter 306 is responsive to falling edges of an input signal in the embodiment of FIG. 3. Thus, a terminal count of 3 causes the output of counter 306 to switch when three falling edges are received at input 308. In some embodiments of the present invention, counter 306 may be configured to count only to a single terminal count (e.g., 3). In other embodiments of the present invention, counter 306 may be controlled by suitable logic circuitry that causes counter 306 to count to any one of a plurality of terminal counts (e.g., 2, 3, 4, etc.). Logic circuitry suitable for controlling counter 306 and for providing control signals CTRL1 and CTRL2 should be apparent to one of ordinary skill in the art based on, for example, the description of circuits 200 and 300 and therefore will not be further described. Counter 306, set/reset flip flop 302 and D flip flop 304 are described in this example as providing zero delay times. In actual circuit implementations, these circuit elements provide nonzero delay times. For example, counter 306 and D flip flop 304 may provide fixed delays of 50 ps each (e.g., the time required for a signal to propagate through 2 inverter circuits) and set/reset delay 302 may provide a fixed delay of 25 ps.

Configured as set forth above, delay circuit 200 provides a delay of 1250 ps as follows: With the count of counter 306 initialized to zero, and set/reset flip flop 302 outputting the control signal (CTRL3) that selects input 208 of multiplexer 202 (i.e., a logic "0" in this example), circuit loop 212 closes which causes multiplexer 202 to receive input 208. For reasons described below, input 208 is initially a logic "1." Thus, because multiplexer 202 is an inverting multiplexer, multiplexer 202 outputs a logic "0" to the input of delay element 204 after a delay of 100 ps. This causes delay element 204 to output a logic "0" to input 208 after a delay of 80 ps. Thus, after completing one cycle through circuit loop 212, the signal is delayed by 180 ps (i.e., $d_{loop212}$). Counter 306 receives the logic "0" at input 308 (from the output of delay element 206), which causes counter 306 to increase its count to 1.

The logic "0" at input 208 cycles through loop circuit 212 and returns to input 208 as a logic "1". This second cycle through loop 212 provides an additional delay of 180 ps (i.e., $d_{loop212}$) for a cumulative delay of 360 ps. D flip flop 304 receives the logic "1" at input 312 (from the output of delay element 206), which causes D flip flop 304 to transfer the logic "0" at input 314 (i.e., the logic "0" output by set/reset flip flop 302) to reset input 318 of set/reset flip flop 302. As described above, input 312 of D flip flop 304 is responsive to logic "1" in the embodiment of FIG. 3. Set input 310 and reset input 318 are also responsive to logic "1" in the embodiment of FIG. 3. Thus, the logic "0" at reset input 318 does not cause the output of set/reset flip flop 302 to change.

The logic "1" at input 208 cycles through loop circuit 212 and returns to input 208 as a logic "0". This third cycle through loop 212 provides an additional delay of 180 ps (i.e., $d_{loop212}$) for a cumulative delay of 540 ps. Counter 306 receives the logic "0" at input 308 (from the output of delay element 206), which causes counter 306 to increase its count to 2.

The logic "0" 1 at input 208 cycles through loop circuit 212 and returns to input 208 as a logic "1". This fourth cycle through loop 212 provides an additional delay of 180 ps (i.e., $d_{loop212}$) for a cumulative delay of 720 ps. D flip flop 304 receives the logic "1" at input 312 (from the output of delay element 206), which causes D flip flop 304 to transfer the logic "0" from data input 314 to reset input 318 of set/reset flip flop 302. Again, the output of set/reset flip flop 302 does not change because reset input 318 is only responsive to logic "1" in the embodiment of FIG. 3.

The logic "1" at input 208 cycles through loop circuit 212 and returns to input 208 as a logic "0". This fifth cycle through loop 212 provides an additional 180 ps (i.e., $d_{loop212}$) for a cumulative delay of 900 ps. Delay element 206 receives the logic "0" signal from the output of delay element 204, and delays the signal by 85 ps. This causes the cumulative delay to become 985 ps. Delay element 206 outputs the logic "0" to input 210 of multiplexer 202 and input 308 of counter 306. Counter 306 increases its count to 3 in response to receiving the logic "0". Because 3 is the terminal count (TC) of counter 306, counter 306 outputs a logic "1" to set input 310 of set/reset flip flop 302. The count of counter 306 initializes to zero. In response to receiving the logic "1" at set input 310, set/reset flip flop 302 outputs a logic "1" control signal (CTRL3) that selects input 210 of multiplexer 202. This causes circuit loop 212 to open and circuit loop 214 to close. Preferably, multiplexer 202 switches from input 208 to input 210 before either of the logic "0" signals at inputs 208 and 210 changes to logic "1". This may mean, for example, that control signal (CTRL3) must select input 210 before the logic "0" at input 208 can propagate through circuit loop 212 and return to input 208 as a logic "1". In general, this can be accomplished by selecting counter 308 as a fast counter. Switching multiplexer 202 when inputs 208 and 210 have the same logic value advantageously prevents glitches in the output of delay circuit 200, which as described below may be the output of counter 306.

The logic "0" at input 210 cycles through loop circuit 214 and returns to input 210 as a logic "1". This cycle through loop 214 provides an additional delay of 265 ps (i.e., $d_{loop214}$) for a cumulative delay of 1250 ps. D flip flop 304 receives the logic "1" at data input 312 from the output of delay element 206, which causes D flip flop 304 to transfer the logic "1" at input 314 (i.e., the logic "1" output by set/reset flip flop 302) to reset input 318 of set/reset flip flop 302. In response, set/reset flip flop 302 outputs the control signal (CTRL3) that reselects input 208 of multiplexer 202 (i.e., a logic "0" in this example). This causes circuit loop 214 to open and causes circuit loop 212 to close. In order to prevent glitches in the output of circuit 200, multiplexer 202 preferably switches from input 210 to input 208 before either of the logic "1" signals at inputs 208 and 210 changes to logic "0". Digital delay circuit 200 is thus reset to the initial conditions described above (i.e., counter 306 initialized to a count of zero and input 208 initially a logic "1"). Provided that no adjustments are made to the terminal count (TC) of counter 306 and to the delays of delay elements 204 and 206, circuit 200 again delays the logic "1" signal at input 208 by 1250 ps in the manner described above.

The output of circuit 200 can be taken as the output of counter 306 which switches every 1250 ps in the embodiment of FIG. 3. Adjustments of the terminal count (TC) of counter 306 and of the delays of delay elements 204 and 206 cause the output of counter 306 to switch more or less frequently. The output of counter 306 in the embodiment of FIG. 3 does not have a 50% duty cycle (i.e., the counter output is not logic "1" for the same amount of time that the counter output is logic "0"). In order to obtain an output signal with about a 50% duty cycle, the output of delay element 206 can be coupled to the inputs of first and second counters other than counter 306. The first counter counts to a terminal count of N and the second counter counts to a terminal count of about N/2. The outputs of the first and second counters are respectively coupled to the reset and set inputs of a set/reset flip flop. The output of the set/reset flip flop provides a signal having about a 50% duty cycle.

In general, the total delay ($d_{total}$) of delay circuit 200 when circuit 200 is used in connection with logic circuit 300 in the manner described above can be represented by the following equation:

$$d_{total} = 2*TC*d_{mux} + 2*TC*d_{204} + 2*d_{206}$$

This shows that varying the time delay of delay element 206 ($d_{206}$) typically results in finer delay adjustments to $d_{total}$ than varying the time delay of delay element 204 ($d_{204}$). Particularly, variations to $d_{204}$ (i.e., using digital control signal CTRL2) are multiplied by 2*TC in order to calculate the corresponding adjustment to the total delay of digital delay circuit 200. Variations to $d_{206}$ (i.e., using control signal (CTRL1)) are only multiplied by 2. This equation also shows that varying TC (i.e., the terminal count of counter 306) typically results in the most coarse of the delay adjustments to $d_{total}$. Particularly, variations to TC are multiplied by ($2*d_{mux} + 2*d_{204}$) in order to calculate the corresponding adjustment to the total delay of digital delay circuit 200. In the example of FIG. 3, adjusting TC of counter 306 by 1 (where $d_{204}$ and $d_{206}$ stay the same) causes $d_{total}$ to change by 360 ps (i.e., 2*100+2*80=360 ps). Adjusting $d_{204}$ by 5 ps (where TC and $d_{206}$ stay the same) causes $d_{total}$ to change by 30 ps (i.e., 2*3*5=30 ps). Adjusting $d_{206}$ by 5 ps (where TC and $d_{204}$ stay the same) causes $d_{total}$ to change by 10 ps (2*5=10 ps). Moreover, the resolution of such a circuit 200 stays the same regardless of the total delay that circuit 200 provides. Contrast this to the resolution of conventional delay circuit 100 (FIG. 1), which becomes lower as the total delay of that circuit 100 can provide increases. Particularly, the resolution of circuit 200 is equal to the minimum delay adjustment that circuit 200 can provide, which is the 10 ps delay adjustment associated with delay element 206.

In some embodiments of the present invention, digital delay circuit 200 may be used in digital phase-locked loop (PLL) and digital delay-locked loop (DLL) implementations. Typically, digital PLLs and DLLs include phase detecting circuitry (e.g., a phase/frequency detector), logic circuitry and a delay circuit. The phase detecting circuitry receives a reference clock signal and a signal output by the delay circuit as input. The phase detecting circuitry compares the input signals, and outputs the results of this comparison to the logic circuitry. Based on the results of this comparison, the logic circuitry outputs digital control signals to the delay circuit. Preferably, these control signals adjust the delay of the delay circuit to a delay that locks the output clock to the reference clock. For example, the logic circuitry may be used to adjust one or more of CTRL1 of delay element 206, CTRL2 of delay element 204 and the control signal that can be provided in order to select the terminal count of counter 306. When the comparison indicates that only a small delay adjustment is needed to lock the output clock to the reference clock, the logic circuitry may adjust CTRL1 of delay element 206. When the comparison indicates that a moderate delay adjustment is needed, the logic circuitry may adjust CTRL2 of delay element 204. When the comparison indicates that a larger delay adjustment is needed, the logic circuitry may adjust the terminal count of counter 306.

Logic circuit 300 may be used in connection with digital delay circuit 200 when circuit 200 is used in a PLL implementation. When circuit 200 is used in a DLL implementation, logic circuit 300 may be modified in order to allow reselection of input 208 (i.e., selection of input 208 after circuit 200 achieves its total delay) to be synchronized to the reference clock. Particularly, after the total delay of circuit 200 (e.g., 1250 ps) is achieved, logic circuit 300 may delay outputting the control signal (CTRL3) that reselects input 208 until circuit 300 receives the next clock edge (e.g., rising edge) of the reference clock. Ways of modifying logic circuit 300 for use in connection with digital delay circuit 200 for a DLL implementation should be apparent to one of ordinary skill in the art based on, for example, the above description of the DLL implementation and therefore will not be further described.

Figure 4:
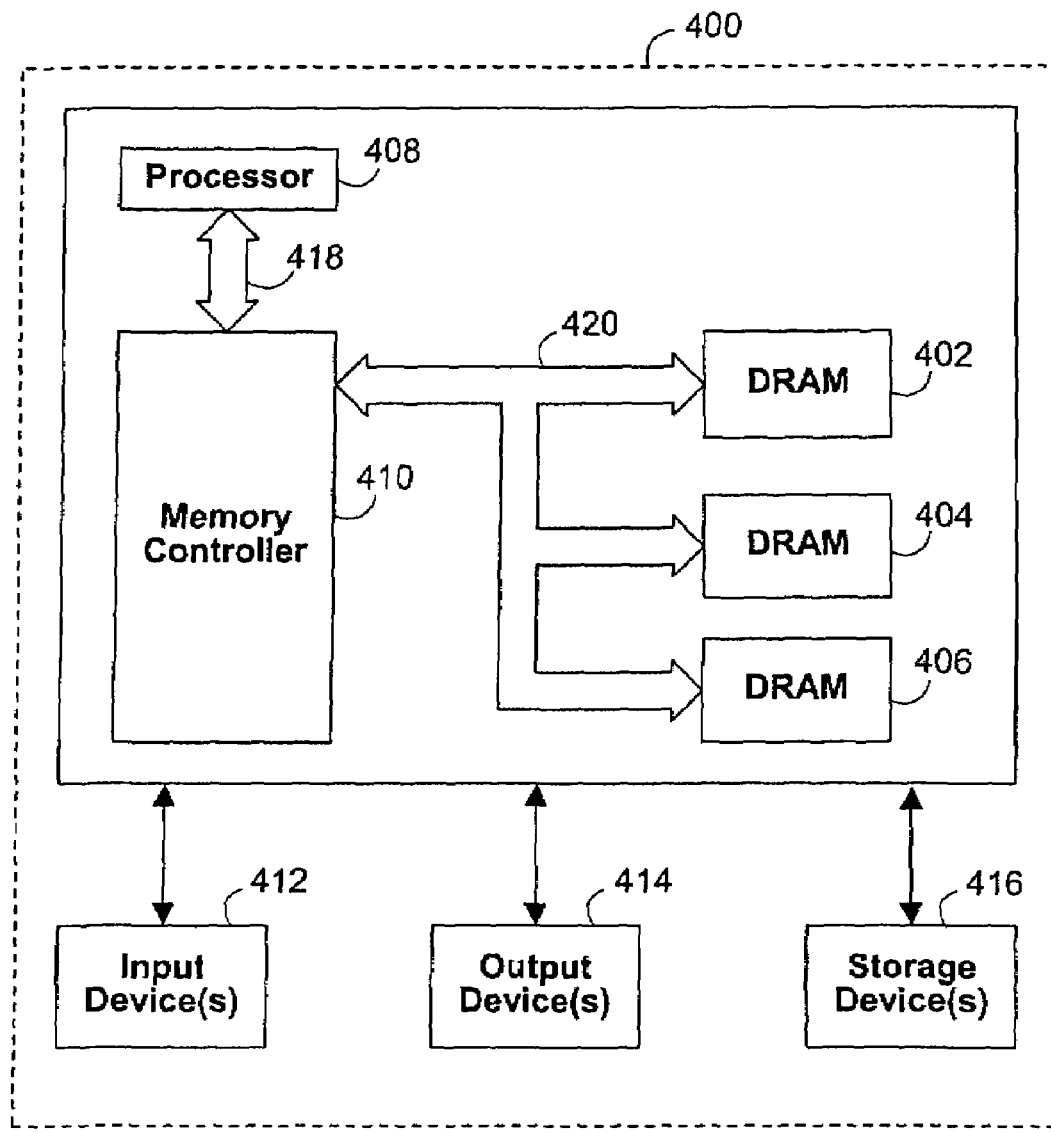
FIG. 4 is a block diagram of a system that incorporates the invention.

FIG. 4 shows a system 400 that incorporates the invention. System 400 includes a plurality of DRAM chips 402, 404 and 406, a processor 408, a memory controller 410, input devices 412, output devices 414, and optional storage devices 416. DRAM chips 402–406 include an array of memory cells. One or more DRAM chips 402–406 also include one or more digital delay circuits of the invention. The circuits of the invention may be implemented in connection with an associated PLL or DLL that, for example, synchronizes one or more of DRAM read, write and refresh operations to a reference clock received from memory controller 410. Data and control signals are transferred between processor 408 and memory controller 410 via bus 418. Similarly, data and control signals are transferred between memory controller 410 and DRAM chips 402–406 via bus 420. Input devices 412 can include, for example, a keyboard, a mouse, a touch-pad display screen, or any other appropriate device that allows a user to enter information into system 400. Output devices 414 can include, for example, a video display unit, a printer, or any other appropriate device capable of providing output data to a user. Note that input devices 412 and output devices 414 can alternatively be a single input/output device. Storage devices 416 can include, for example, one or more disk or tape drives.

Thus it is seen that circuits and methods for providing high resolution digital delay are provided. One skilled in the art will appreciate that the invention can be practiced by other than the described embodiments, which are presented for purposes of illustration and not of limitation, and the present invention is limited only by the claims which follow.

I claim:

1. A digital delay circuit comprising;
   a first delay element;
   a second delay element having a first input and a second input, wherein said first input is in communication with an output of said first delay element and wherein said second input is operative to receive a digital control signal for adjusting a time delay that said second delay element provides;
   a multiplexer having a first input, a second input, a third input and an output, wherein said first input of said multiplexer is in communication with said output of said first delay element, said second input of said multiplexer is in communication with an output of said second delay element and said output of said multiplexer is in communication with an input of said first delay element, and wherein said third input of said multiplexer is operative to receive a control signal that selects which of said first and second inputs of said multiplexer is selected as said output of said multiplexer; and
   a counter operative to:
      receive an indication from said output of said second delay element that a signal has cycled through a circuit loop comprising said multiplexer and said first delay element;
      increment a count each time said indication is received; and
      in response to said count being equal to a predetermined number, output a signal that causes said second input of said multiplexer to be selected as said output of said multiplexer.

2. The digital delay circuit of claim 1, wherein said first delay element is a fixed delay element.

3. The digital delay circuit of claim 1, wherein said first delay element is operative to receive a digital control signal for adjusting a time delay that said first delay element provides.

4. The digital delay circuit of claim 3, wherein said digital control signal of said first delay element and said digital control signal of said second delay element are different control signals that can be independently adjusted.

5. The digital delay circuit of claim 1, wherein said digital control signal of said second delay element and said control signal of said multiplexer are different control signals.

6. The digital delay circuit of claim 1, wherein said multiplexer is an inverting multiplexer.

7. The digital delay circuit of claim 1, wherein said circuit loop provides an odd number of signal inversions.

8. The digital delay circuit of claim 1, wherein said circuit loop provides an odd number of signal inversions.

9. The digital delay circuit of claim 1, wherein said signal output by said counter causes said second input of said multiplexer to be selected as said output of said multiplexer when said first and second inputs of said multiplexer have the same logic value.

10. The digital delay circuit of claim 1, wherein said signal output by said counter causes a signal to propagate through a second circuit loop comprising said multiplexer, said first delay element and said second delay element.

11. The digital delay circuit of claim 10, wherein said second circuit loop provides an odd number of signal inversions.

12. The digital delay circuit of claim 10, further comprising logic circuitry operative to:
   receive an indication that a signal has cycled through said second circuit loop; and
   output a signal that causes said first input of said multiplexer to be selected as said output of said multiplexer in response to receiving said indication that said signal has cycled through said second circuit loop.

13. The digital delay circuit of claim 12, wherein said logic circuitry receives said indication from said output of said second delay element.

14. The digital delay circuit of claim 12, wherein said logic circuitry outputs said signal when said signal completes one cycle through said second circuit loop.

15. A digital delay circuit comprising:
   means for providing a first delay;
   means for providing a second delay, said means for providing said second delay having a first input and a second input, wherein said first input is in communication with an output of said means for providing said first delay and wherein said second input is operative to receive a digital control signal for adjusting a time delay that said means for providing said second delay provides;
   means for receiving said output of said means for providing said first delay, an output of said means for providing said second delay and a control signal, wherein said control signal selects which of said output of said means for providing said first delay and said output of said means for providing said second delay is output by said means for receiving, wherein said output of said means for receiving is in communication with an input of said means for providing a first delay;
   means for obtaining an indication that a signal has cycled through a circuit loop comprising said means for receiving and said means for providing said first delay, wherein said indication is obtained from said output of said means for providing said second delay;
   means for incrementing a count each time said indication is received; and
   means for outputting, in response to said count being equal to a predetermined number, a signal that causes said output of said means for providing said second delay to be output by said means for receiving.

16. The digital delay circuit of claim 15, wherein said means for providing said first delay comprises means for providing a fixed delay.

17. The digital delay circuit of claim 15, wherein said means for providing said first delay is operative to receive a digital control signal for adjusting a time delay that said means for providing said first delay provides.

18. The digital delay circuit of claim 17, wherein said digital control signal of said means for providing said first delay and said digital control signal of said means for providing said second delay are different control signals that can be independently adjusted.

19. The digital delay circuit of claim 15, wherein said digital control signal of said means for providing said second delay and said control signal of said means for receiving are different control signals.

20. The digital delay circuit of claim 15, wherein said means for receiving comprises means for receiving and inverting said output of said means for providing said first delay and said output of said means for providing said second delay.

21. The digital delay circuit of claim 15, wherein said predetermined number is adjustable.

22. The digital delay circuit of claim 15, wherein said circuit loop provides an odd number of signal inversions.

23. The digital delay circuit of claim 15, wherein said signal output by said means for outputting causes said output of said means for providing said second delay to be output by said means for receiving when said output of said means for providing said first delay and said output of said means for providing said second delay have the same logic value.

24. The digital delay circuit of claim 15, wherein said signal output by said means for outputting causes a signal to propagate through a second circuit loop comprising said means for receiving, said means for providing a first delay and said means for providing a second delay.

25. The digital delay circuit of claim 24, wherein said second circuit loop provides an odd number of signal inversions.

26. The digital delay circuit of claim 24, further comprising;
   means for obtaining an indication that a signal has cycled through said second circuit loop; and
   means for outputting, in response to said obtaining said indication that said signal has cycled through said second circuit loop, a signal that causes said output of said means for providing said first delay to be output by said means for receiving.

27. The digital delay circuit of claim 26, wherein said means for obtaining said indication that said signal has cycled through said second circuit loop comprises means for obtaining said indication from said output of said means for providing said second delay.

28. The digital delay circuit of claim 26, wherein said means for outputting comprises means for outputting, in response to said signal completing one cycle through said second circuit loop, said signal that causes said output of said means for providing said first delay to be output by said means for receiving.

29. A method for providing an adjustable delay, said method comprising:
   providing a first delay;
   providing a second delay by introducing additional delay to said first delay, wherein said additional delay is digitally adjustable;
   receiving a first signal delayed by said first delay and a second signal delayed by said second delay;
   providing a control signal that selects which of said first signal and said second signal is selected, in response to receiving a signal delayed by one of said first and second delay steps; and
   delaying said selected signal by said first delay
   obtaining an indication from said second signal that a signal has cycled through a loop comprising said first delay;
   incrementing a count each time said indication is received; and
   outputting, in response to said count being equal to a predetermined number, a signal that causes said second signal to be selected.

30. The method of claim 29, wherein said providing said first delay comprises providing a fixed delay.

31. The method of claim 29, wherein said providing said first delay comprises providing a first delay that is digitally adjustable.

32. The method of claim 31, wherein said first delay and said second delay are digitally adjustable by different control signals that can be independently adjusted.

33. The method of claim 29, wherein a digital control signal that adjusts the delay of said second delay and said control signal that selects said first signal and said second signal are selected are different control signals.

34. The method of claim 29, wherein said receiving said first signal and said second signal comprises receiving and inverting said first signal and said second signal.

35. The method of claim 29, wherein said predetermined number is adjustable.

36. The method of claim 29, wherein said loop provides an odd number of signal inversions.

37. A method for providing an adjustable delay, said method comprising;
   providing a first delay;
   providing a second delay by introducing additional delay to said first delay, wherein said additional delay is digitally adjustable;
   receiving a first signal delayed by said first delay and a second signal delayed by said second delay;
   receiving a control signal that selects which of said first signal and said second signal is selected
   obtaining an indication from said second signal that a signal has cycled through a loop comprising said first delay;
   incrementing a count each time said indication is received; and
   outputting, in response to said count being equal to a predetermined number, a signal that causes said second signal to be selected when said first signal and said second signal have the same logic value.

38. A method for providing an adjustable delay, said method comprising:
   providing a first delay;
   providing a second delay by introducing additional delay to said first delay, wherein said additional delay is digitally adjustable;
   receiving a first signal delayed by said first delay and a second signal delayed by said second delay;
   receiving a control signal that selects which of said first signal and said second signal is selected
   obtaining an indication that a signal has cycled through a loop comprising said first delay;
   incrementing a count each time said indication is received; and
   outputting, in response to said count being equal to a predetermined number, a signal that causes said second signal to be selected, wherein outputting said signal causes a signal to propagate through a loop comprising said second delay.

39. The method of claim 38, wherein said loop comprising said second delay provides an odd number of signal inversions.

40. The method of claim 38, further comprising:
   obtaining an indication that a signal has cycled through said loop comprising said second delay; and
   outputting, in response to said obtaining said indication that said signal has cycled through said loop comprising said second delay, a signal that causes said first signal to be selected.

41. The method of claim 40, wherein said obtaining said indication that said signal has cycled through said loop comprising said second delay comprises obtaining said indication from said second signal.

42. The method of claim 40, wherein said outputting said signal that causes said first signal to be selected comprises outputting said signal that causes said first signal to be selected in response to said signal cycling through said loop comprising said second delay completing one cycle through said loop comprising said second delay.

* * * * *